United States Patent [19]
Hinks

[11] Patent Number: 5,229,717
[45] Date of Patent: Jul. 20, 1993

[54] SIMULTANEOUS TWO-CONTRAST FAST SPIN ECHO NMR IMAGING

[75] Inventor: Richard S. Hinks, Waukesha, Wis.

[73] Assignee: General Electric Company, Milwaukee, Wis.

[21] Appl. No.: 887,989

[22] Filed: May 22, 1992

[51] Int. Cl.$^5$ ............................................ G01R 33/20
[52] U.S. Cl. ..................... 324/309; 324/307
[58] Field of Search ................ 324/309, 307, 300

[56] References Cited

U.S. PATENT DOCUMENTS

| | | | |
|---|---|---|---|
| 4,818,940 | 4/1989 | Hennig et al. | 324/309 |
| 4,833,407 | 5/1989 | Holland et al. | 324/309 |
| 4,881,033 | 11/1989 | Denison | 324/309 |
| 4,884,029 | 11/1989 | Sattin | 324/309 |
| 4,896,113 | 1/1990 | Pelc | 324/309 |
| 4,901,020 | 2/1990 | Ladebeck et al. | 324/309 |
| 4,949,042 | 8/1990 | Kuhara et al. | 324/309 |
| 5,051,699 | 9/1991 | Hanawa et al. | 324/309 |
| 5,168,226 | 12/1992 | Hinks | 324/309 |

OTHER PUBLICATIONS

N. J. Pelc, et al., Low Equivalent Bandwidth MRI with Decreased Chemical Shift Artifact, *SMRM Sixth Meeting Abstracts,* p. 389, 1987.

N. Higuchi, et al., Two-Contrast RARE: A Fast Spin-Density and $T_2$-Weighted Imaging Method, *Journal of Magnetic Resonance Imaging,* vol. 1, No. 2, p. 147, 1991.

*Primary Examiner*—Michael J. Tokar
*Assistant Examiner*—Raymond Y. Mah
*Attorney, Agent, or Firm*—Quarles & Brady

[57] ABSTRACT

A fast spin-echo NMR pulse sequence is modified to produce a pair of gradient recalled echo signals between each successive pair of RF refocusing pulses. The first gradient recalled echo signal in each pair is acquired and employed to reconstruct a first image and the second gradient recalled echo signal in each pair is employed to reconstruct a second image. The two gradient recalled echo signals in each pair are separately phase encoded such that the two reconstructed images having contrasting $T_2$-weighting.

5 Claims, 5 Drawing Sheets

SIMULTANEOUS TWO-CONTRAST FAST SPIN ECHO NMR IMAGING

BACKGROUND OF THE INVENTION

The field of the invention is nuclear magnetic resonance imaging methods and systems. More particularly, the invention relates to the simultaneous acquisition of multiple images of differing contrast using a fast spin echo NMR scan.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_O$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished shed by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Most NMR scans currently used to produce medical images require many minutes to acquire the necessary data. The reduction of this scan time is an important consideration, since reduced scan time increases patient throughput, improves patient comfort, and improves image quality by reducing motion artifacts.

The concept of acquiring NMR image data in a short time period has been known since 1977 when the echo-planar pulse sequence was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and variations on this pulse sequence are disclosed in U.S. Pat. Nos. 4,678,996; 4,733,188; 4,716,369; 4,355,282; 4,588,948 and 4,752,735.

A variant of the echo planar imaging method is the Rapid Acquisition Relaxation Enhanced (RARE) sequence which is described by J. Hennig et al in an article in *Magnetic Resonance in Medicine* 3, 823–833 (1986) entitled "RARE Imaging: A Fast Imaging Method for Clinical MR." The essential difference between the RARE sequence and the EPI sequence lies in the manner in which echo signals are produced. The RARE sequence utilizes RF refocused echoes generated from a Carr-Purcell-Meiboom-Gill sequence, while EPI methods employ gradient recalled echoes.

Both of these "fast spin echo" imaging methods involve the acquisition of multiple spin echo signals from a single excitation pulse in which each acquired echo signal is separately phase encoded. Each pulse sequence, or "shot," therefore results in the acquisition of a plurality of views, and single shot scans are commonly employed with the EPI method. However, a plurality of shots are typically employed to acquire a complete set of image data when the RARE fast spin echo sequence is employed. For example, a RARE pulse sequence might acquire 8 or 16 separate echo signals, per shot, and an image requiring 256 views would, therefore, require 32 or 16 shots respectively.

In clinical applications of fast spin echo imaging sequences, more than one image is often acquired during a single scan. The images depict the same structures in the patient, but different structures are enhanced in each image by employing $T_2$-weighted effects. For example, one image of a joint may be reconstructed from early echo signals in each shot to provide enhancement of structures having a short $T_2$ decay, such as muscle tissue. The second image may be reconstructed from later echo signals in each shot to provide enhancement of structures having a longer $T_2$ decay, such as joint fluid. Such multi-image fast spin echo imaging sequences are described by N. Higuchi et al in an abstract in *Journal of Magnetic Resonance Imaging*, Vol. 1, No. 2, pg. 147, 1991 entitled "Two-Contrast RARE: A Fast Spin-Density and $T_2$-Weighted Imaging Method." It should be apparent that when additional images are acquired during a scan, more spin echo signals must be acquired and the length of the scan is increased proportionately.

SUMMARY OF THE INVENTION

The present invention relates to an improved fast spin echo sequence in which data for two images may be acquired in little more than the scan time required for a single FSE image. More particularly, the FSE pulse sequence is modified by producing a readout gradient waveform which produces a pair of gradient recalled NMR echo signals in place of the single NMR spin echo signal normally acquired between each pair of RF refocusing pulses. Each gradient recalled NMR echo signal is separately acquired and used to reconstruct two separate images. Because each gradient recalled NMR echo signal may be separately phase encoded, different views are acquired for each of the two images and these may be judiciously selected to provide $T_2$-weighted contrast differences between the two images.

A general object of the invention is to acquire two different FSE images without substantially increasing scan time. With little increase in scan time an FSE pulse sequence which acquires data for one image can be modified accordingly to the present invention to acquire data for two separate images.

Another general object of the invention is to efficiently acquire data for two FSE images which have different $T_2$-weighted contrast. Conventional phase encoding pulses are employed to phase encode the first gradient recalled NMR echo signal such that the central views of the first image are acquired early in each shot. As a result, the first image provides enhancement of structures having a short $T_2$ decay, such as muscle tissue. On the other hand, a "kicker" phase encoding pulse is added between the two gradient recalled NMR echo signals such that the second gradient recalled NMR echo signal is encoded for a different view. By acquiring the central views of the second image later in each shot, structures having a longer $T_2$ decay, such as joint fluid, are enhanced in the second reconstructed image.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
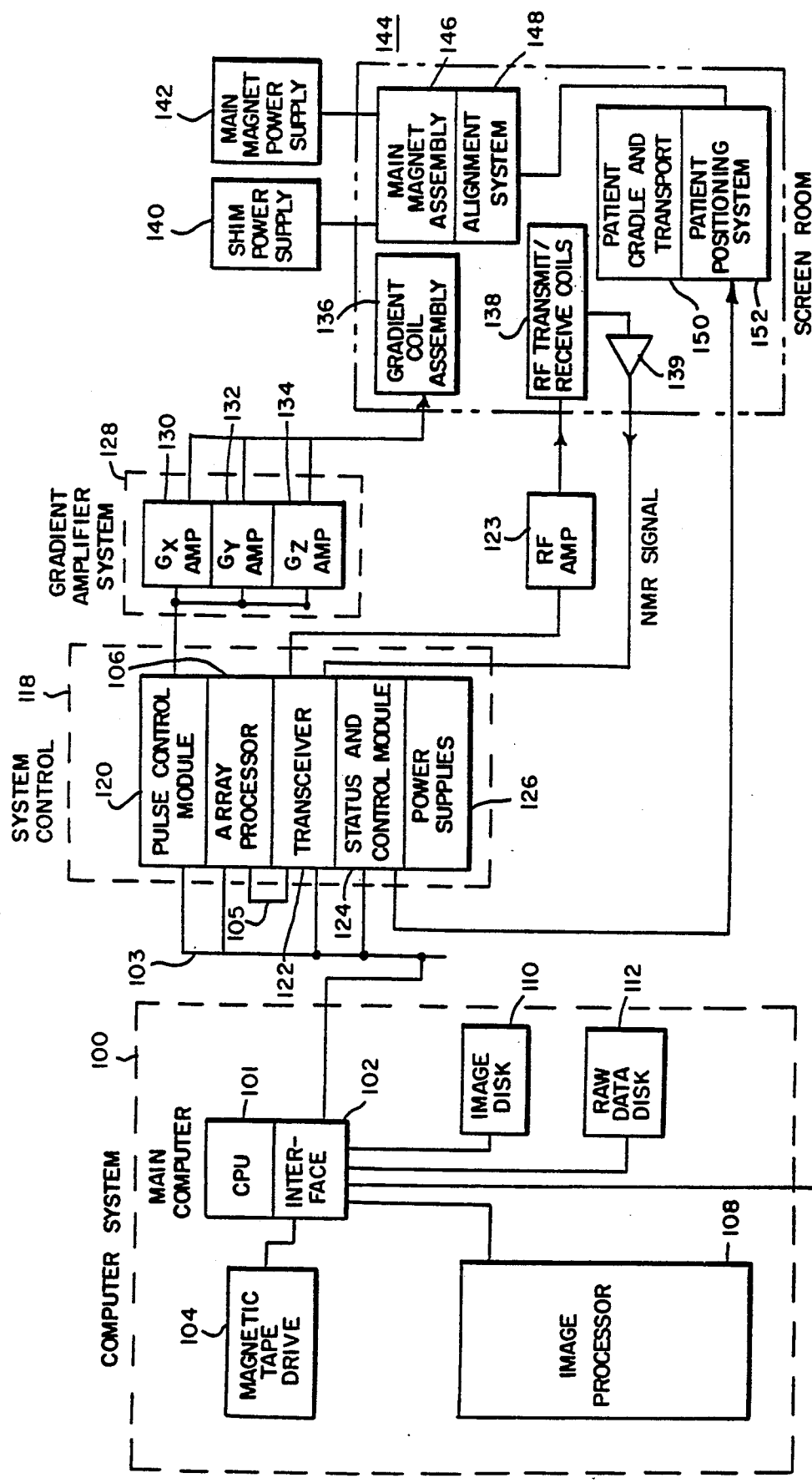
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z / \partial X$, $G_y = \partial B_z / \partial Y$ and $G_z = \partial B_z / \partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF-shielded room generally designated 144.

Figure 2:
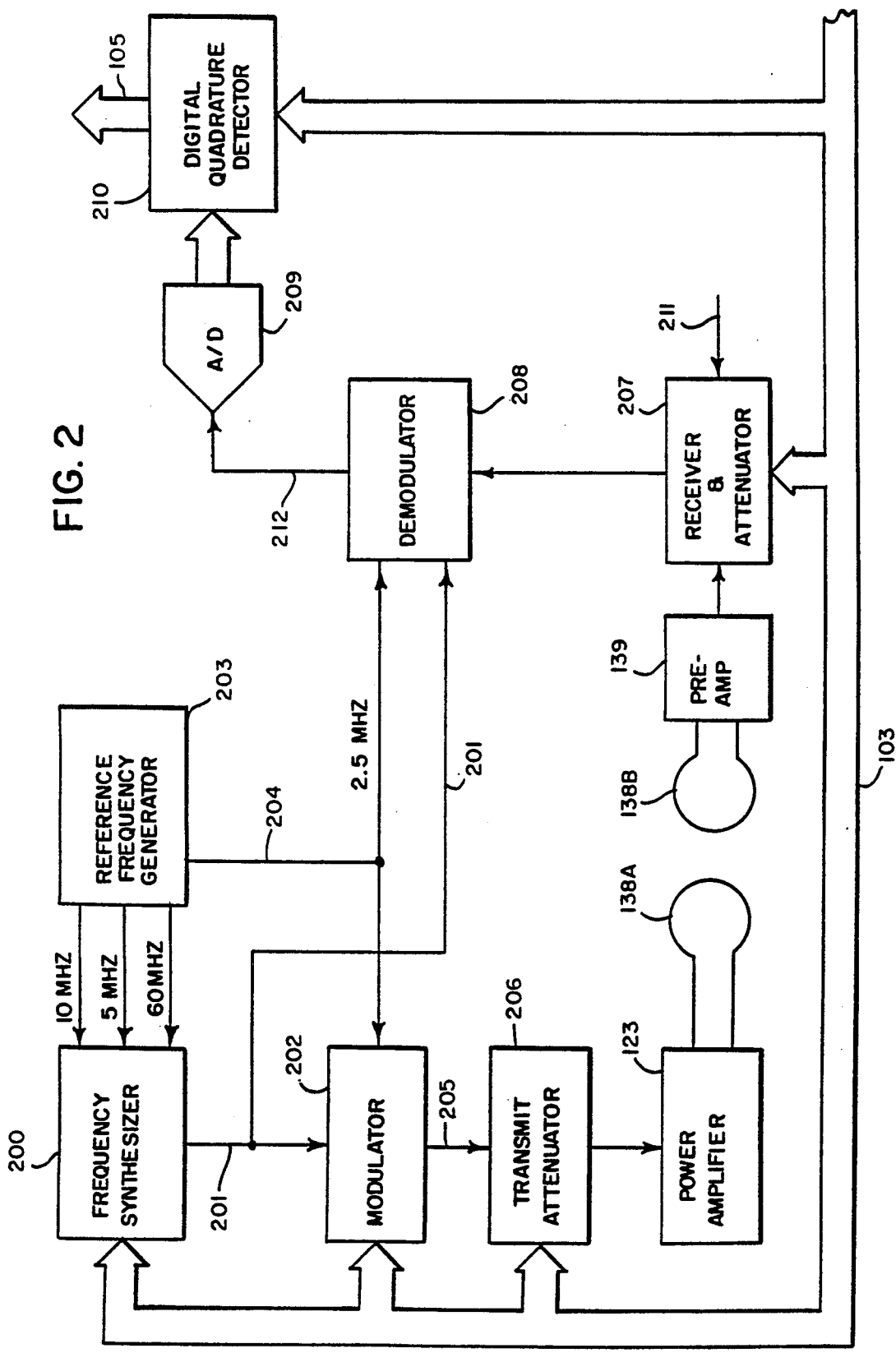
FIG. 2 is an electrical block diagram of the transceiver which forms part of the NMR system of FIG. 1.

Referring particularly to FIGS. 1 and 2, the transceiver 22 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through the link 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
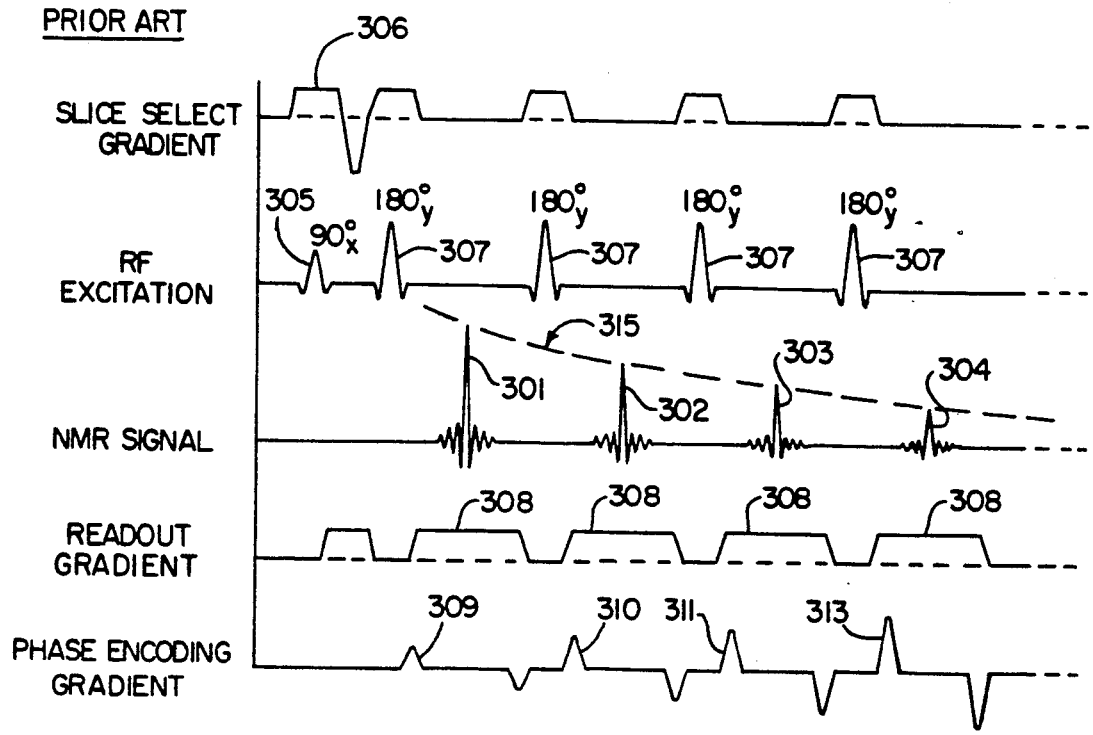
FIG. 3 is a graphic representation of a conventional fast spin echo pulse sequence.

Referring particularly to FIG. 3, a conventional fast spin echo NMR pulse sequence, known as a 2DFT RARE sequence is shown. For clarity, only four echo signals 301–304 are shown in FIG. 3, but it can be appreciated that more are produced and acquired. These NMR echo signals are produced by a 90° RF excitation pulse 305 which is generated in the presence of a $G_z$ slice select gradient pulse 306 to provide transverse magnetization in a slice through the patient. This transverse magnetization is refocused by each selective 180° RF echo pulse 307 to produce the NMR spin echo signals 301–304 that are acquired in the presence of $G_x$ readout gradient pulses 308. Each NMR spin echo signal 301–304 is separately phase encoded by respective $G_y$ phase encoding pulses 309–313. The magnitude of each phase encoding pulse is different, and it is stepped through 256 values to acquire 256 separate views during a complete scan. This enables an image having 256 separate pixels in the y direction to be reconstructed. Each NMR spin echo signal is acquired by digitizing 256 samples of each signal. As a result, at the completion of a scan for one image, 16 shots (256/16=16) of the pulse sequence of FIG. 3 have been executed and a 256 by 256 element array of complex numbers have been acquired. An image is reconstructed by performing a 2D Fourier transformation on this image data array and then calculating the absolute value of each resulting complex element. A 256 by 256 pixel image is thus produced in which the brightness of each pixel is determined by the magnitude of its corresponding element in the transformed array.

Referring still to FIG. 3, the $T_2$ decay in the NMR spin echo signals 301-304 is illustrated by the dashed line 315. The rate of decay is different for different tissue types and a common strategy in FSE NMR imaging is to enhance the contrast in certain tissues over other tissues by judiciously selecting an effective echo time which is determined primarily by the actual echo time (TE) of the central, or low-order, views that dominate image contrast. For example, to enhance muscle tissue in the image of a human knee joint, the first spin echo signals may be encoded to a low-order phase encoding value in each shot because the $T_2$ decay rate of muscle tissue is high and the shortest possible effective echo time (TE) is desired. On the other hand, to produce an image in which the fluids in the knee joint are enhanced, the low-order phase encoding views may be acquired from later echo signals which have a much longer echo time TE. The $T_2$ decay rate of joint fluids is much less than that of muscle tissue, and as a result, these fluids will contribute proportionately more signal and their contrast will be enhanced in comparison with that of muscle tissue. It is common clinical practice, therefore, to acquire data for a number of images, with each image having a different "$T_2$-weighting" to enhance the contrast of different tissue types. One method for acquiring a plurality of images with different effective TE echo times is to acquire multiple image data sets in a single scan as is commonly done in conventional spin echo imaging.

It should be apparent that for each of the plurality of images which are to be produced during a scan, an image data array must be acquired having the number of elements, or samples, that will yield an image of the desired resolution. In the preferred embodiment a 256 by 256 element image data array is required, and as described above, this requires sixteen shots using the fast spin echo sequence of FIG. 3 to acquire a single image. In prior NMR systems, an additional sixteen shots are required for each additional image that is to be produced during the scan. For two images, therefore, thirty-two shots are required and the scan time is doubled.

Figure 4:
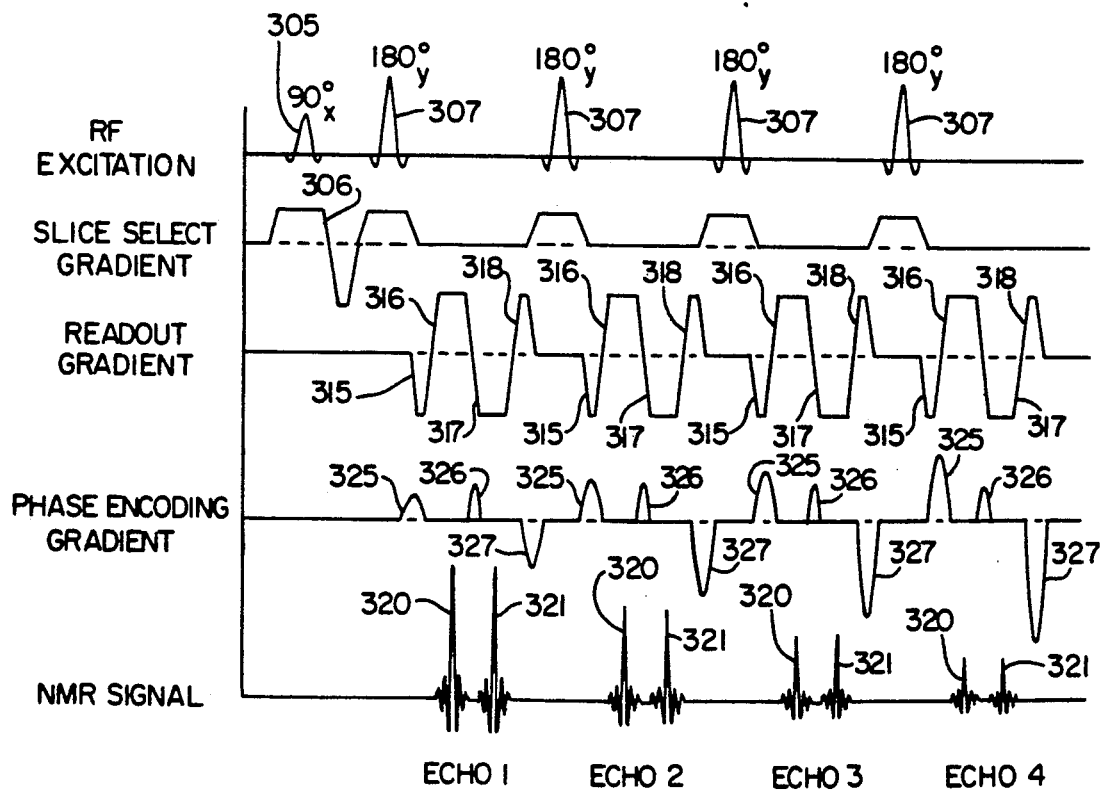
FIG. 4 is a graphic representation of the improved fast spin echo pulse sequence which employs the present invention.

The present invention is a modification of the FSE pulse sequence of FIG. 3 such that data for two separate images may be acquired in substantially the same scan time. For example, data for two separate 256 by 256 pixel images can be acquired in sixteen shots rather than thirty-two. Referring particularly to FIG. 4, the RF excitation pulses 305 and 307 and the slice select gradient pulses 306 are the same as in the conventional FSE pulse sequence described above. However, the readout gradient has been substantially changed to produce a waveform comprised of four gradient pulses 315, 316, 317 and 318 between each pair of 180° RF refocusing pulses 307. The first gradient pulse 315 dephases the spins and the first half of the second gradient pulse 316 rephases them to produce a first gradient recalled NMR echo signal 320. The first echo signal 320 is acquired during the second readout gradient pulse 316 which frequency encodes it for position along the readout gradient axis.

The second half of the readout gradient pulse 316 again dephases the spins, and the first half of the third gradient pulse 317 rephases them to produce a second gradient recalled NMR echo signal 321. The second echo signal 321 is acquired during the third readout gradient pulse 317, which frequency encodes the 256 digital samples for position along the readout gradient axis. The fourth and final readout gradient pulse 318 rephases the spins before the next RF refocusing pulse 307 and its area is such that the zeroth moment of the readout gradient waveform is zero between each pair of RF refocusing pulses 307.

Figure 9:
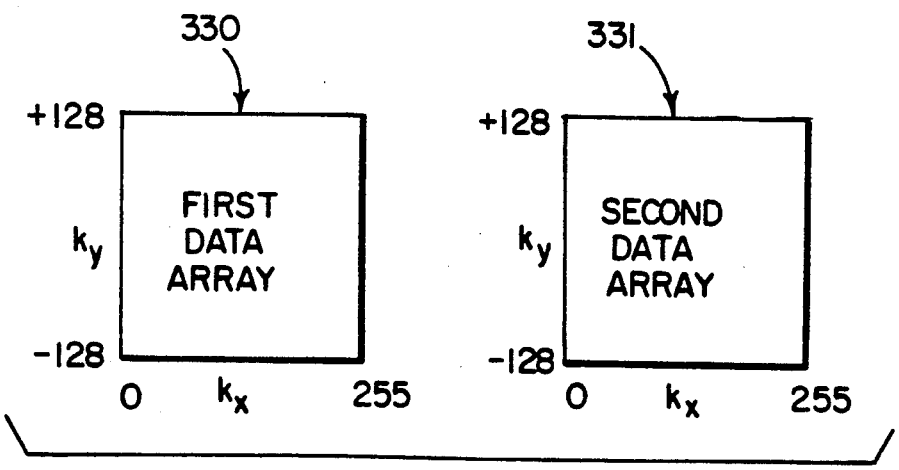
FIG. 9 is a pictoral representation of the data arrays acquired with the pulse sequence of FIG. 4.

As shown in FIG. 4, the readout gradient waveform is repeated between each pair of RF refocusing pulses 307 to produce corresponding pairs of gradient recalled NMR echo signals 320 and 321. In a sixteen shot pulse sequence, therefore, thirty-two NMR echo signals are produced. For the purpose of the discussion below, each pair of NMR echo signals 320 and 321 will be referred to with the same echo number. As shown in FIG. 9, the first NMR echo signals 320 are acquired and used to form a first 256 by 256 element data array 330 from which a first image is reconstructed, and the second NMR echo signals 321 are acquired and used to form a second 256 by 256 element data array 331 from which a second image is reconstructed. By separately phase encoding the first and second NMR echo signals, as will now be described, the order in which the views of these two images are acquired is substantially different with the result that contrasting $T_2$-weighted images may be reconstructed.

Referring still to FIG. 4, the phase encoding gradient waveform is comprised of three pulses 325, 326 and 327 which are repeated between each pair of RF refocusing pulses 307. The first pulse 325 phase encodes the first NMR signal 320 in each pair 320 and 321, and it is stepped through its 256 discrete values during the scan to acquire each view of the first image. Any view order can be implemented, but in the preferred embodiment, the central views are acquired early during each of the sixteen shots so that the first image enhances the contrast in short $T_2$ decay structures.

The second phase encoding pulse 326 occurs after the first echo signal 320, but before the second echo signal 321. The second NMR echo signal 321 is, therefore, phase encoded by the sum of the areas of the first two phase encoding pulses 325 and 326. While it is possible to vary the size of the second pulse 326 to provide any desired view order acquisition of the second image, in the preferred embodiment this is not done. Instead, the second phase encoding pulse 326 has a constant value throughout the scan such that the view acquired for the second image is always a fixed offset from the view acquired for the first image. While this creates some complexities which will be discussed below, the use of a constant "kicker" gradient pulse 326 throughout the scan simplifies the pulse sequence and reduces the burden on the phase encoding gradient amplifiers and coils.

The third pulse 327 in the phase encoding gradient waveform is a rewinder pulse which occurs after the acquisition of the second NMR echo signal 321. It has an area which is equal to the sum of the areas of the first two phase encoding pulses 325 and 326, but is opposite in polarity. As a result, the zeroth moment of the phase encoding waveform between each pair of RF refocusing pulses 07 is equal to zero.

Figure 5A:
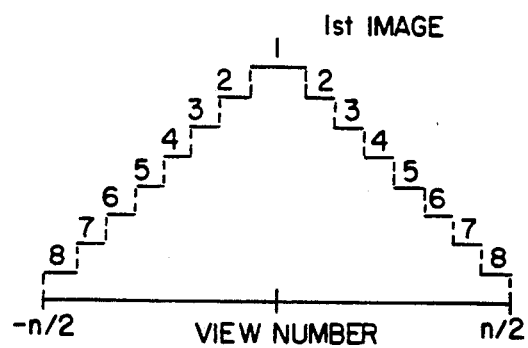
FIGS. 5A and 5B are graphic illustrations of the manner in which data for two images is acquired with the prior art pulse sequence of FIG. 3.
Figure 5B:
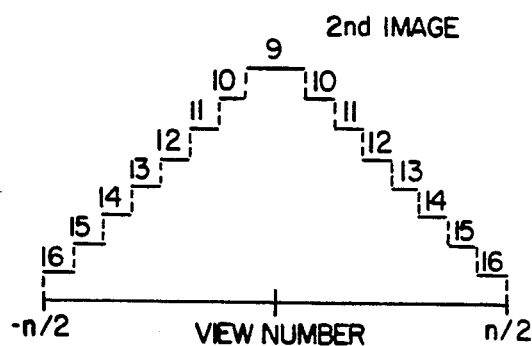

The present invention may be employed in many ways to obtain two images with contrasting $T_2$-weighting. The manner in which this is done with prior FSE pulse sequences is illustrated in FIGS. 5A and 5B. In this example, sixteen echo signals are acquired during each "shot," with the data from the first eight echoes being used to acquire all n views for the first reconstructed image, and the data from the last eight echoes in each shot being used to reconstruct the second image. The time interval between the first and ninth echo signal provides the desired $T_2$ contrast between the two images.

Figure 6A:
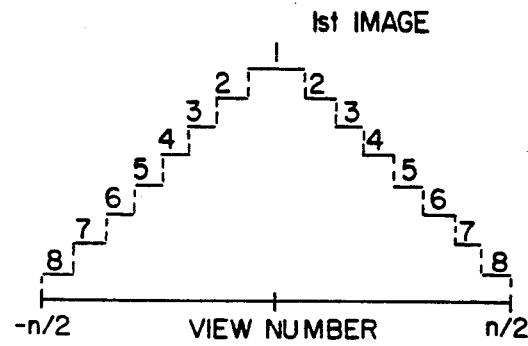
FIGS. 6A and 6B are graphic illustrations of the manner in which data for two images may be acquired using the pulse sequence of FIG. 4.
Figure 6B:
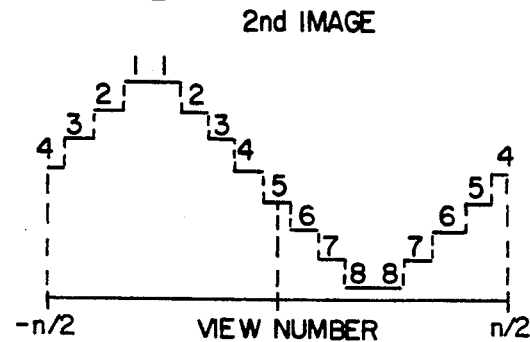

Using the present invention, the same data may be acquired using a pulse sequence which may be roughly half as long. Consequently, the total scan time may be roughly one half that of the prior art FSE scans. Two ways to implement the present invention are illustrated in FIGS. 6 and 7. Referring to FIGS. 6A and 6B, in the embodiment the first image is acquired from the first NMR echo signal 320 in each of the eight echo signal pairs, and these first echo signals 320 are phase encoded by the first phase encoding pulse 325 to acquire all n views using the echo number shown in FIG. 6A. On the other hand, as shown in FIG. 6B the second image is acquired from the second NMR echo signal 321 in each of the eight echo signal pairs, and these are phase encoded by the second phase encoding pulse 326 to acquire all n views in a different order. Whereas the central views in the first image are acquired from early echoes (1–2), the central views for the second image are acquired from later echoes (4–6). The $T_2$ contrast is provided by the delay between the first and fifth echo signals in this embodiment.

While the embodiment illustrated in FIGS. 6A and 6B accomplishes the desired result of acquiring the data in roughly one half the scan time, to phase encode the second NMR echo signal 321 in the indicated order is very demanding. That is, the second phase encoding pulse 326 must be changed in value quite dramatically during the scan and it must reach very high magnitudes.

Figure 7A:
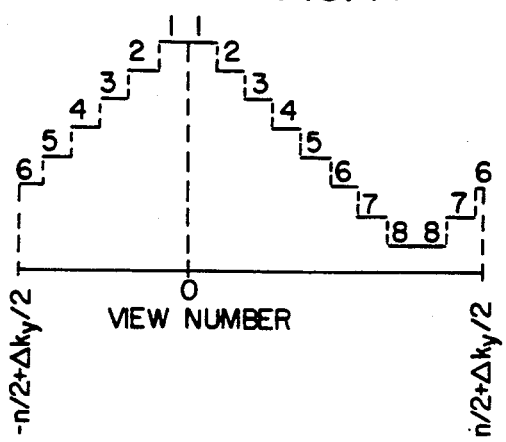
FIGS. 7A and 7B are graphic illustrations of the manner in which data for two images is acquired with the pulse sequence of FIG. 4 in the preferred embodiment.
Figure 7B:
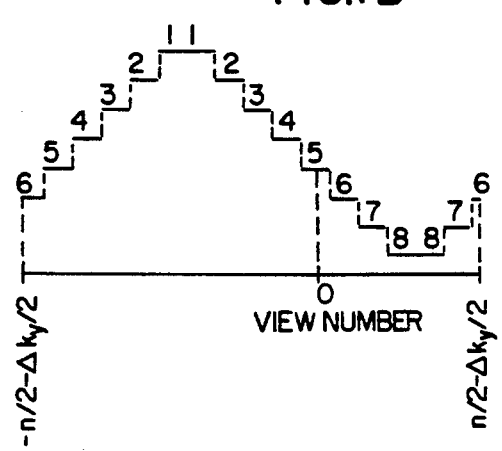
Figure 8:
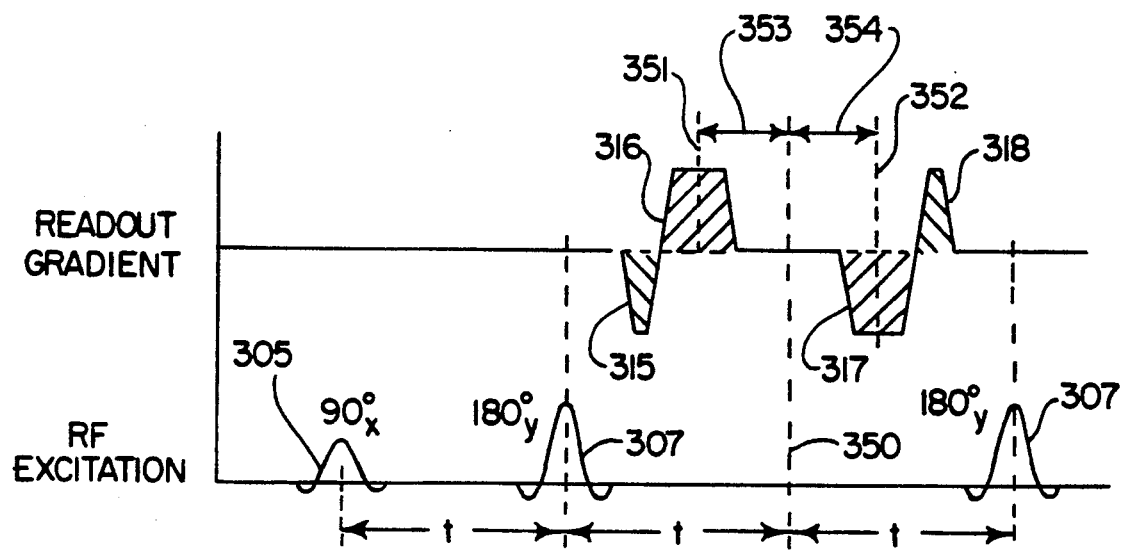
FIG. 8 is a graphic representation of an alternative embodiment of the pulse sequence of FIG. 4.

A preferred embodiment of the invention is illustrated in FIGS. 7A and 7B. In this embodiment the second phase encoding pulse 326 remains constant throughout the scan at a level ($\Delta ky$) which provides the desired $T_2$ contrast. The acquisition patterns for the two images are the same, but they are shifted off center by the amount ($\Delta ky/2$). As a result, the acquisition pattern of the raw NMR data is asymmetric with respect to the $k_y$ axis. A reconstruction algorithm such as that described by D. C. Noll, D. G. Nishimura and A. Macovski in "Homodyne Detection in Magnetic Resonance Imaging," *IEEE Trans. On Med. Image.*, May 9, 1990 may be employed to reconstruct the image, taking into account the asymmetry in the raw NMR data. The gradient recalled echo signals 320 and 321 produced according to the present invention may be position modulated to provide another image contrast mechanism of diagnostic merit. Referring to FIG. 8, the readout gradient waveforms can be spaced apart such that the time interval between NMR echo signals 320 and 321 can be modulated. The Hahn spin echo is produced midway between the RF refocusing pulses 307 as indicated by the dashed line 350. The gradient recalled echoes 320 and 321 are spaced to each side of this central axis 350, and the amount of that spacing is determined by the location of the readout gradient pulses 315–318. The first echo signal 320 is centered along an axis indicated at 351 and the second echo signal is centered along an axis indicted at 352. Each gradient recalled echo signal 320 and 321 is, therefore, offset from the axis 350 of the Hahn spin echo by amounts indicated at 353 and 354.

The two gradient recalled echo signals 320 and 321 are subject to spin dephasing due to chemical shift because they are offset from the spin echo axis 350 where this effect is nulled. The dominant result is that the signal components due to body fat will be out of phase with with signal components due to water. In a 1.5 Tesla field the chemical shift of fat and water is about 218 Hz, which means they go through one cycle relative to each other in 4.6 msec. Hence if the two echo signals 320 and 321 are offset 2.3 msec. from the spin echo axis 350 the signal components of fat and water in each signal are 180° out of phase and signal cancellation will affect the image. On the other hand, if the offsets are each 4.6 msec., then the signal components re back in phase. The out of phase images have diagnostic value because the signal cancellation reduces brightness in regions where both fat and water are present. These occur at fat-water boundaries and in bone marrow where the fat content tends to make the image unusually bright. The amount of offset is controllable by the operator when configuring the pulse sequence prior to the scan, and this simply adjusts the spacing between the two sections of the readout gradient waveform.

We claim:

1. An NMR system, the combination comprising:
means for generating a polarizing magnetic field;
excitation means for generating an RF excitation magnetic field which produces transverse magnetization in spins subjected to the polarizing magnetic field;
receiver means for sensing the NMR signal produced by the transverse magnetization and producing digitized samples of the NMR signal;
first gradient means for generating a first magnetic field gradient to phase encode the NMR signal;
second gradient means for generating a second magnetic field gradient to frequency encode the NMR signal;
pulse control means coupled to the excitation means, first gradient means, second gradient means, and receiver means, said pulse control means being operable to conduct a scan in which a series of pulse sequences are conducted to acquire digitized samples of NMR signals which enable a pair of images to be reconstructed;
a pair of image array storage means each coupled to the receiver means and each storing digitized samples of the NMR signals required to reconstruct one of said images;
wherein the pulse control means operates during the scan to perform a fast spin echo pulse sequence in which a set of RF refocusing pulses are produced by said excitation means, the second, gradient means generates a waveform which produces a pair of gradient recalled NMR echo signals between each successive pair of RF refocusing pulses, the first gradient means generates a waveform that separately phase encodes each gradient recalled NMR echo signal in each of said gradient, the first gradient recalled NMR echo signal in each of said pair is sensed by the receiver means and stored in the first of said pair of gradient recalled NMR echo signals of image array storage means, and the second gradient recalled NMR echo signal in each of said pairs is sensed by the receiver means and stored in the second of said pair of image array storage means.

2. The NMR system as recited in claim 1 in which the phase encoding in each gradient recalled NMR echo signal is stepped through a sequence of values such that low order views stored in the first of said pair of image array storage means are acquired from gradient recalled NMR echo signals, which occur early in said fast spin echo pulse sequence, and the low order views stored in the second of said pair of image array storage means are acquired from gradient recalled NMR echo signals which occur later in said fast spin echo pulse sequence.

3. The NMR system as recited in claim 1 in which the waveform generated by the second gradient means is shaped to produce the first of each pair of gradient recalled NMR echo signals prior to the midpoint between successive pairs of RF refocusing pulses, and to produce the second of each pair of gradient recalled NMR echo signals after the midpoint between successive pairs of RF refocusing pulses.

4. The NMR system as recited in claim 3 in which one of said gradient recalled NMR echo signals in each pair is spaced from the midpoint to produce a chemical shift such that signal components therein due to fat are out of phase with signal components therein due to water.

5. The NMR system as recited in claim 3 in which one of said gradient recalled NMR echo signals in each pair is spaced from the midpoint to produce a chemical shift such that signal components therein due to fat are in phase with signal components therein due to water.

* * * * *

UNITED STATES PATENT AND TRADEMARK OFFICE
CERTIFICATE OF CORRECTION

PATENT NO. : 5,229,717
DATED : July 20, 1993
INVENTOR(S) : Richard Scott Hinks

It is certified that error appears in the above-identified patent and that said Letters Patent is hereby corrected as shown below:

In the Abstract, line 9, "having" should be --have--.

Column 1, line 34, "xy" should be --x-y--.

Column 1, line 51, "accomplished shed by" should be --accomplished by--.

Column 5, lines 40-41, "transceiver 22" should be --receiver 122--.

Column 9, line 8, "pulses 07" should be --pulses 307--.

Column 10, line 26, "components re back" should be --components are back--.

In the Claims:

Column 10, line 65, "second, gradient" should be --second gradient--.

UNITED STATES PATENT AND TRADEMARK OFFICE
CERTIFICATE OF CORRECTION

PATENT NO. : 5,229,717
DATED : July 20, 1993
INVENTOR(S) : Richard Scott Hinks

It is certified that error appears in the above-identified patent and that said Letters Patent is hereby corrected as shown below:

Column 11, lines 3, "said gradient," should be --said pair of gradient recalled NMR echo signals,--

Column 11, lines 6,7, "pair of gradient recalled NMR echo signals of image" should be --pair of image--.

Column 11, line 9, "said pairs is" should be -- said pair of gradient recalled NMR echo signals is--.

Column 11, line 17, "signals, which" should be --signals which--.

Signed and Sealed this

Twenty-second Day of March, 1994

Attest:

BRUCE LEHMAN

*Attesting Officer*    *Commissioner of Patents and Trademarks*